United States Patent [19]
Hendricks et al.

[11] Patent Number: 5,608,337
[45] Date of Patent: Mar. 4, 1997

[54] METHOD AND APPARATUS OF TESTING AN INTEGRATED CIRCUIT DEVICE

[75] Inventors: Matthew C. Hendricks, Palo Alto, Calif.; Ernest Allen, Hillsboro, Oreg.

[73] Assignee: Altera Corporation, San Jose, Calif.

[21] Appl. No.: 481,744

[22] Filed: Jun. 7, 1995

[51] Int. Cl.$^6$ .................................................. G01R 31/28
[52] U.S. Cl. ................................................ 324/765
[58] Field of Search ................................ 324/754, 755, 324/756, 757, 758, 765

[56] References Cited

U.S. PATENT DOCUMENTS

| | | | |
|---|---|---|---|
| 4,694,242 | 9/1987 | Peterson et al. | 324/73 |
| 4,827,211 | 5/1989 | Strid et al. | 324/758 |
| 5,001,422 | 3/1991 | Dahlberg et al. | 324/158 |
| 5,331,571 | 7/1994 | Aronoff et al. | 364/490 |
| 5,392,297 | 2/1995 | Bell et al. | 371/22.6 |
| 5,396,032 | 3/1995 | Bonham, Jr. et al. | 174/52.4 |
| 5,399,505 | 3/1995 | Dasse et al. | 437/8 |

*Primary Examiner*—Kenneth A. Wieder
*Assistant Examiner*—Barry C. Bowser
*Attorney, Agent, or Firm*—Townsend and Townsend and Crew LLP

[57] ABSTRACT

A method and apparatus for testing an integrated circuit device. An integrated circuit device undergoes testing in at least two different stages of the manufacturing process. At one stage, the semiconductor wafer containing multiple chip dice is probed by a probe tester that tests each of the dice individually. At another stage, after an individual chip die has been encapsulated in a package, a package tester tests and exercises the functions of the chip.

33 Claims, 4 Drawing Sheets

METHOD AND APPARATUS OF TESTING AN INTEGRATED CIRCUIT DEVICE

BACKGROUND OF THE INVENTION

The present invention relates generally to the manufacturing and testing of integrated circuit chips. Specifically, a method and apparatus are provided for testing an integrated circuit chip having more signal pins than the number of available channels on a integrated circuit chip tester.

Integrated circuit chips customarily undergo exhaustive testing during the manufacture process prior to encapsulation in a package or use of the package on a circuit board in order to ensure reliable operation of the chip. The chip die undergoes functional and parametric testing in at least two different stages of the manufacturing process. At one stage, the semiconductor wafer containing multiple chip dice is probed by a probe tester that tests each of the dice individually. At another stage, after an individual chip die has been encapsulated in a package, a package tester programmed to exercise the functions of the chip couples the tester's channels to signal pins of the integrated circuit chip package. In either case, the device tester applies excitations to and receives responses from the chip being tested under control of the tester in order to provide test results. This procedure generally can be completed in only one testing step since the number of available tester channels is usually greater than or equal to the number of signal pins on an integrated circuit chip die or package to be tested. The tester can thoroughly exercise and test all of the chip's functions in one step since each of the signal pins on the chip package is coupled to a tester channel. However, when testing devices with very high pin counts, the chip die or package might have more signal pins than the number of tester channels, making it impossible to test the chip in only one testing step. Thus, a method and apparatus are needed to efficiently test an integrated circuit chip having more signal pins than the number of available channels on a chip tester.

SUMMARY OF THE INVENTION

The present invention provides a method and apparatus for efficiently testing an integrated circuit chip during manufacture having more signal pins than the number of available channels on a tester by testing the chip in multiple testing steps.

In a preferred embodiment, a plurality of test cards are used for testing the integrated circuit chip, with a unique test card used for each separate testing step. In each step, the test card will connect the tester to all of the test pins dedicated for testing purposes of the chip in addition to a selected subset of user pins employed in common operation of the chip. For example, in one embodiment where a test procedure requires two steps, a first test card couples the tester to all of the chip's test pins and a subset of the chip's user pins, allowing functional and parametric testing to be carried out on the portions of the chip coupled to the first set of pins. Then, a second test card couples the tester to all of the test pins again plus the remaining untested user pins, allowing functional and parametric testing to be carried out on the other portions of the chip coupled to the second set of pins. By spreading the test procedure for the chip among multiple test cards, all signal pins are covered by the tester, even though the tester does not have enough channels to accommodate all of the signal pins on the integrated circuit chip in one testing step.

A further understanding of the nature and advantages of the inventions herein may be realized by reference to the remaining portions of the specification and the attached drawings.

DESCRIPTION OF THE PREFERRED EMBODIMENT

Figure 1:
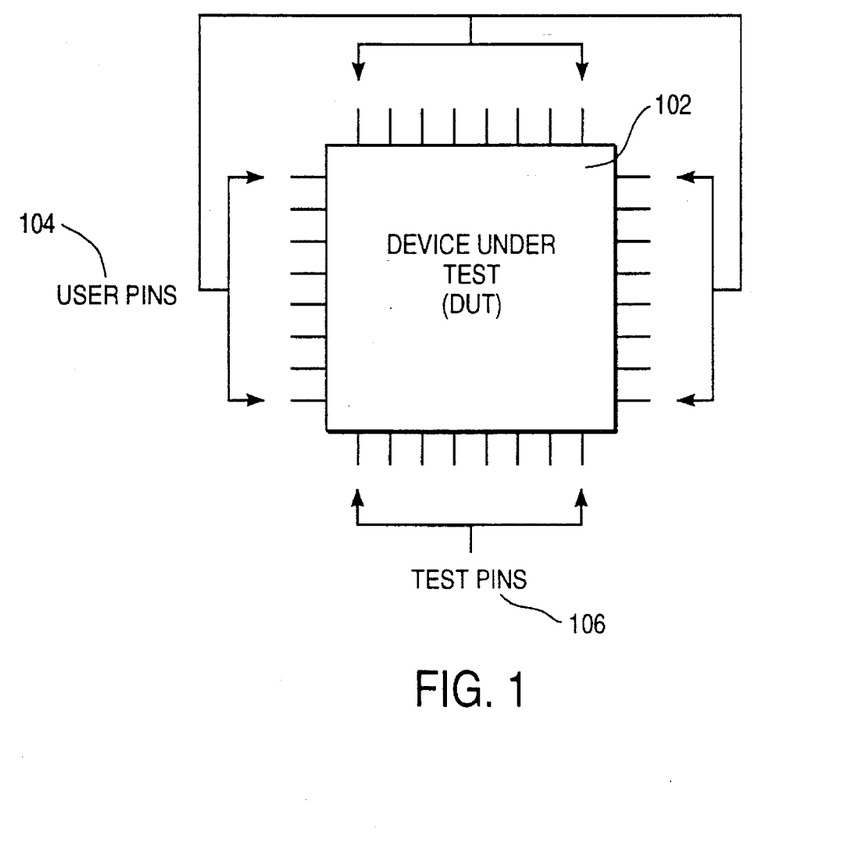
FIG. 1 is a simplified diagram of an integrated circuit device under test.

FIG. 1 is a simplified conceptual diagram of an integrated circuit device under test. The Device Under Test (DUT) 102 may be an individual chip die on a semiconductor wafer or any package type commonly used to package integrated circuit devices, such as a quad-flatpack or a plastic-leaded chip carrier, for example. The DUT 102 may include any integrated circuit, since all integrated circuits must be tested prior to normal use in an electronic circuit. In a preferred embodiment, the integrated circuit of DUT 102 is a programmable logic device (PLD), which is a programmable integrated circuit that allows the user of the circuit, using software control, to customize the logic functions the circuit will perform. In a preferred embodiment of a PLD, DUT 102 includes two types of signal pins, user pins 104 and test pins 106. User pins 104 are used for input and output functions that result from the logic definitions that the user has designed to customize performance of the PLD. Test pins 106 are required for programming and configuring DUT 102 for testing. As a result, test pins 106 must always be coupled to the tester when testing DUT 102. Some DUT architectures allow some or all of test pins 106 to be used for the user's input and output functions when DUT 102 is engaged in user mode after being configured. In general, user pins 104 outnumber test pins 106.

Figure 2:
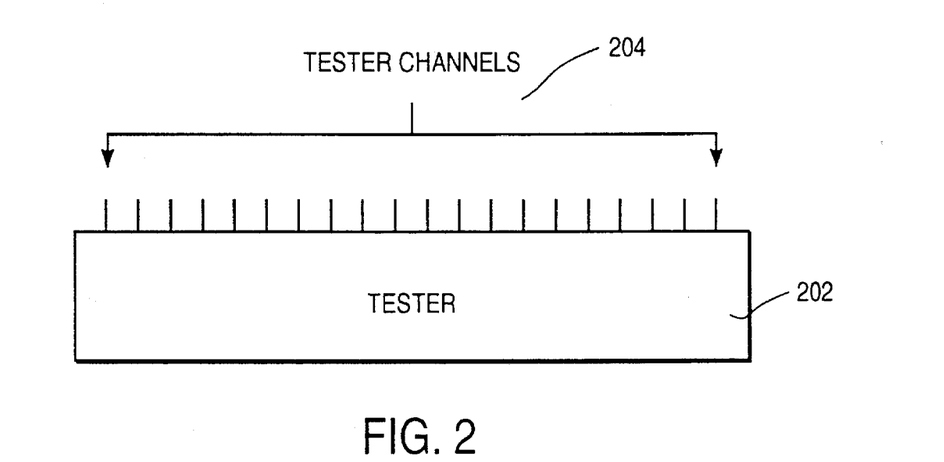
FIG. 2 is a simplified diagram of a tester used to test an integrated circuit device.

FIG. 2 is a simplified conceptual diagram of a tester 202 used to test integrated circuit devices. Tester 202 typically includes circuitry and control software to perform both functional and parametric testing of an integrated circuit chip through the application of appropriate inputs and comparison of resultant outputs against the expected behavior of the integrated circuit chip. Tester 202 includes a set of tester channels 204 which are coupled to the signal pins of DUT 102 (FIG. 1). Tester 202 communicates input signals to and receives outputs from DUT 102 through tester channels 204 in order to exercise and test the integrated circuit of DUT 102. In the case where DUT 102 is a PLD, tester 202 will prepare the integrated circuit for a functional test by configuring it with an appropriate test pattern designed to allow exercising and testing of a particular circuit feature or set of features. This configuration is accomplished through appropriate excitation of the signal pins of DUT 102 through tester channels 204. When tester 202 has enough tester channels 204 to accommodate all signal pins on DUT 102, only one testing step is required to fully exercise and test the functions of DUT 102. However, when the number of signal pins on DUT 102 exceeds the total number of available tester channels 204, one testing step will not be sufficient to test the entire integrated circuit chip.

In order to accommodate the testing of high pin-count integrated circuit devices under this condition, DUT 102 is tested in multiple testing steps. Each testing step will require a unique DUT card, which is a test card that couples tester channels 204 to a selected subset of signal pins on DUT 102. Using multiple DUT cards, all signal pins can be connected to tester channels, allowing the entire integrated circuit to be tested in multiple testing steps. There can be as many unique DUT cards as are necessary to fully exercise and test the functions of DUT 102. In a preferred embodiment where DUT 102 is a PLD, in order to perform a functional test, each DUT card will also require an associated unique set of test patterns to be programmed into DUT 102 by tester 202, as well as a unique set of test vectors to exercise those test patterns.

Figure 3A:
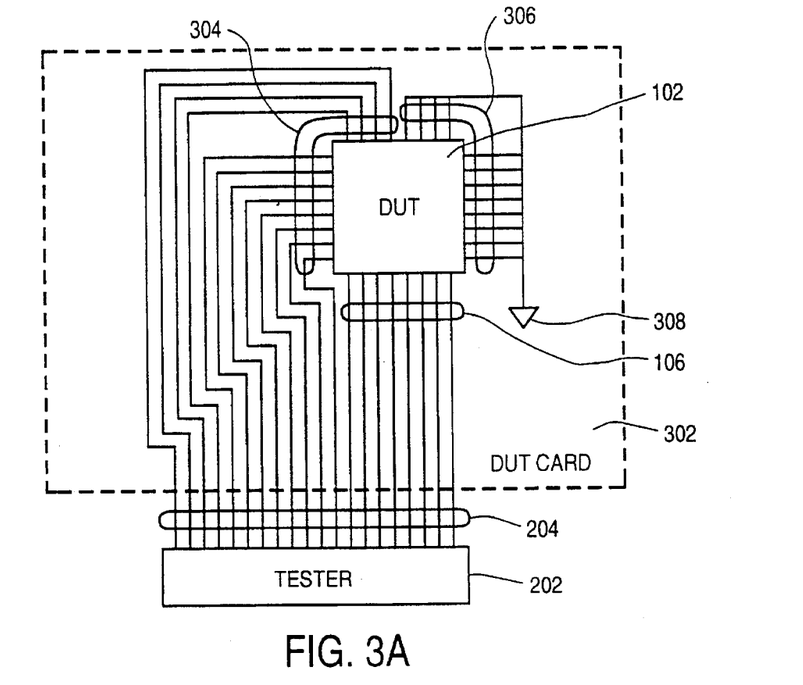
FIG. 3A is a simplified block diagram of a testing configuration of a device having more signal pins than available tester channels.

FIG. 3A is a simplified conceptual block diagram of a testing configuration of a DUT 102 having more signal pins than available tester channels 204 on tester 202. The configuration shown in FIG. 3A is implemented with a unique DUT card 302 that couples tester channels 204 to the signal pins of DUT 102. In a preferred embodiment, where a PLD is the Device Under Test 102, it is only required to couple all test pins 106 of the PLD to tester channels 204 while testing the PLD, but not all user pins 104. This flexibility arises because tester 202 can exercise only portions of the PLD at one time and does not have to exercise the entire PLD in one testing step, since portions of the PLD can operate independently of each other. Therefore, in a preferred embodiment, DUT card 302 couples tester channels 204 to all test pins 106, as required, plus a subset 304 of user pins 104 (FIG. 1). The remaining subset 306 of user pins 104 is coupled to a reference potential in this testing configuration for DUT 102 so that the input buffers of subset 306 of user pins 104 do not float at an uncontrolled voltage and disrupt the testing of DUT 102. It is also possible to couple different groups of pins within subset 306 of user pins 104 to different reference potentials. In the embodiment shown in FIG. 3A, the entire subset 306 of user pins 104 is coupled to a ground potential 308. Accordingly, tester 202 can test and exercise the portion of DUT 102 that is accessible through test pins 106 and subset 304 of user pins 104.

Figure 3B:
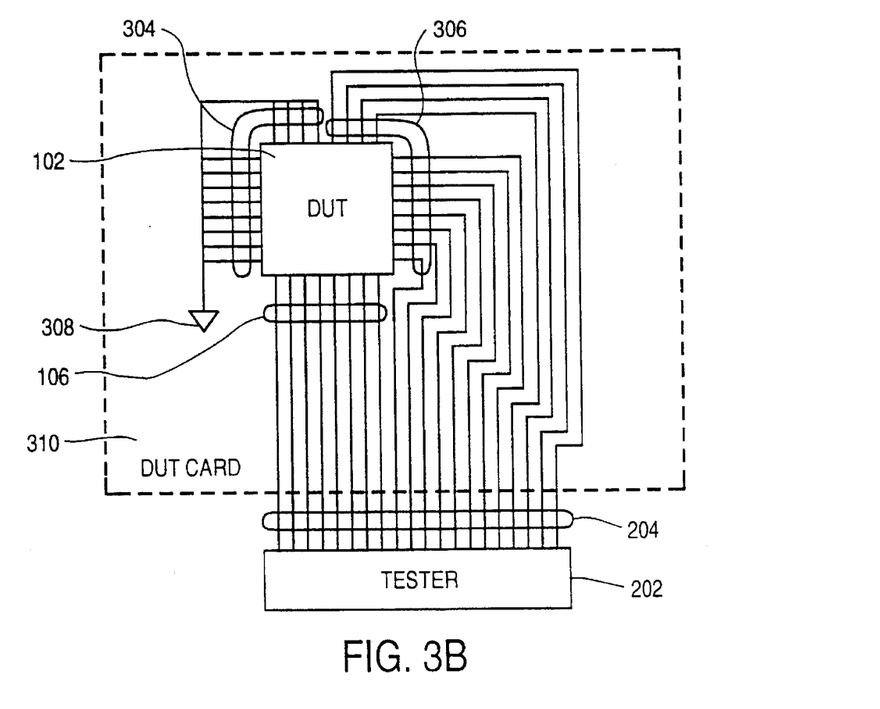
FIG. 3B is a simplified block diagram of another testing configuration of a device having more signal pins than available tester channels.

FIG. 3B is a simplified conceptual block diagram of a subsequent testing configuration of a DUT 102 having more signal pins than available tester channels 204 on tester 202. The present configuration shown in FIG. 3B is implemented with a unique DUT card 310 that couples tester channels 204 to the signal pins of DUT 102. DUT card 310 operates in conjunction with DUT card 302 (FIG. 3A) to fully exercise the entire Device Under Test 102. Thus, DUT card 310 couples tester channels 204 to all test pins 106, as required, plus subset 306 of user pins 104 that were not coupled to tester channels 204 in the first test configuration, shown in FIG. 3A. Tester 202 can now exercise and test those portions of DUT 102 that were not accessed in the previous testing configuration of DUT 102. Subset 304 of user pins 104 that had been coupled to tester channels 204 in the previous configuration shown in FIG. 3A is coupled to a reference potential in the present configuration to avoid floating input buffers. It is again of course possible to couple different groups of pins within subset 304 of user pins 104 to different reference potentials. In the embodiment shown in FIG. 3B, the entire subset 304 of user pins 104 is coupled to ground potential 308. Because tester 202 is coupled through tester channels 204 and subset 306 of user pins 104 to the remaining portions of DUT 102 that were not exercised and tested in the configuration of FIG. 3A, after completing testing in the configuration of FIG. 3B, the tester will have fully tested and exercised DUT 102 in two testing steps.

It should be noted that the two subsets 304 and 306 of user pins 104 need not be mutually exclusive. In another embodiment, some user pins 104 may be shared between subsets 304 and 306 so that there is some overlap between subsets. This might be necessary, for example, in the case where a group of user pins 104 is used as an data bus that is required to exercise and test DUT 102 in both test configurations.

In the preferred embodiment where DUT 102 is a PLD, in addition to requiring a unique DUT card 302 and 310, each configuration shown in FIG. 3A and FIG. 3B will further require a unique set of test patterns to be programmed into DUT 102 as well as a unique set of test vectors to exercise those test patterns in order to perform a functional test of DUT 102. The test patterns programmed into DUT 102 in the first configuration of FIG. 3A will configure DUT 102 to allow testing of those portions of DUT 102 that are accessible through test pins 106 and subset 304 of user pins 104, and the test vectors in the first testing configuration of FIG. 3A will exercise those test patterns. The steps of programming test patterns into DUT 102 and exercising those patterns with test vectors are interleaved until the entire portion of DUT 102 has been functionally tested. Similarly, the test patterns programmed into DUT 102 in the second configuration of FIG. 3B will configure DUT 102 to allow testing of those portions of DUT 102 that are accessible through test pins 106 and subset 306 of user pins 104, and the test vectors in the second testing configuration of FIG. 3B will exercise those test patterns. Again, the steps of programming patterns into DUT 102 and exercising them with vectors are interleaved until the testing process is complete.

Parametric testing of DUT 102 can also be carried out in multiple test steps with a plurality of DUT cards. Both DC and AC parametric tests can be conducted on DUT 102. For example, tester 202 can be programmed to conduct a DC parametric test for open circuits to ensure that there is an electrical connection between a pin and the circuit die, in the case of a wafer, or that the wire bond connection between the die and leadframe has been made, in the case of a package. Similarly, a DC parametric test for electrical shorts would determine whether any short circuits exist in the circuit die at either the wafer or package stages of integrated circuit chip manufacture. Other possible DC parametric tests include a leakage test to look for leakage current due to a damaged gate oxide and a output driver test to ensure that the chip's output buffers can output a sufficient amount of current to drive a load coupled to the chip. Tester 202 may also be programmed to conduct AC parametric testing that verifies the timing characteristics of the wafer or package under test. So, for example, an input pin of DUT 102 could be driven with an input signal and the associated output pin would be strobed to determine whether the signal's propagation delay through DUT 102 was as expected or specified. Similar to the functional testing, different portions of DUT 102 coupled to different sets of signal pins can be subjected to parametric testing with unique DUT cards. So, with reference to FIGS. 3A and 3B, tester 202 can be programmed to carry out DC and AC parametric tests on a first portion of DUT 102 through DUT card 302 in the first testing configuration of FIG. 3A. Tester 202 could then continue parametric testing on a second portion of DUT 102 through DUT card 310 in the second testing configuration of FIG. 3B.

It should be understood that the two testing configurations shown in FIGS. 3A and 3B are an example of the use of multiple testing steps to test an integrated circuit device. If necessary, the method and apparatus of the present invention can be implemented with additional testing configurations. In those cases, the tester channels 204 are coupled to a DUT 102 by as many DUT cards as are needed to fully test and exercise DUT 102. Each DUT card couples tester channels 204 to all test pins 106 and a selected subset of user pins 104 of DUT 102, as described above. The number of DUT cards needed to fully exercise the chip's functions is determined by the number subsets into which user pins 104 must be divided. Each DUT card uniquely couples the tester channels to the signal pins of the integrated circuit chip. Thus, the two DUT cards 302 and 310 in FIGS. 3A and 3B will be different from, for example, the three DUT cards that would be used for testing an integrated circuit chip that has a pin count high enough to warrant three testing steps.

Figure 4:
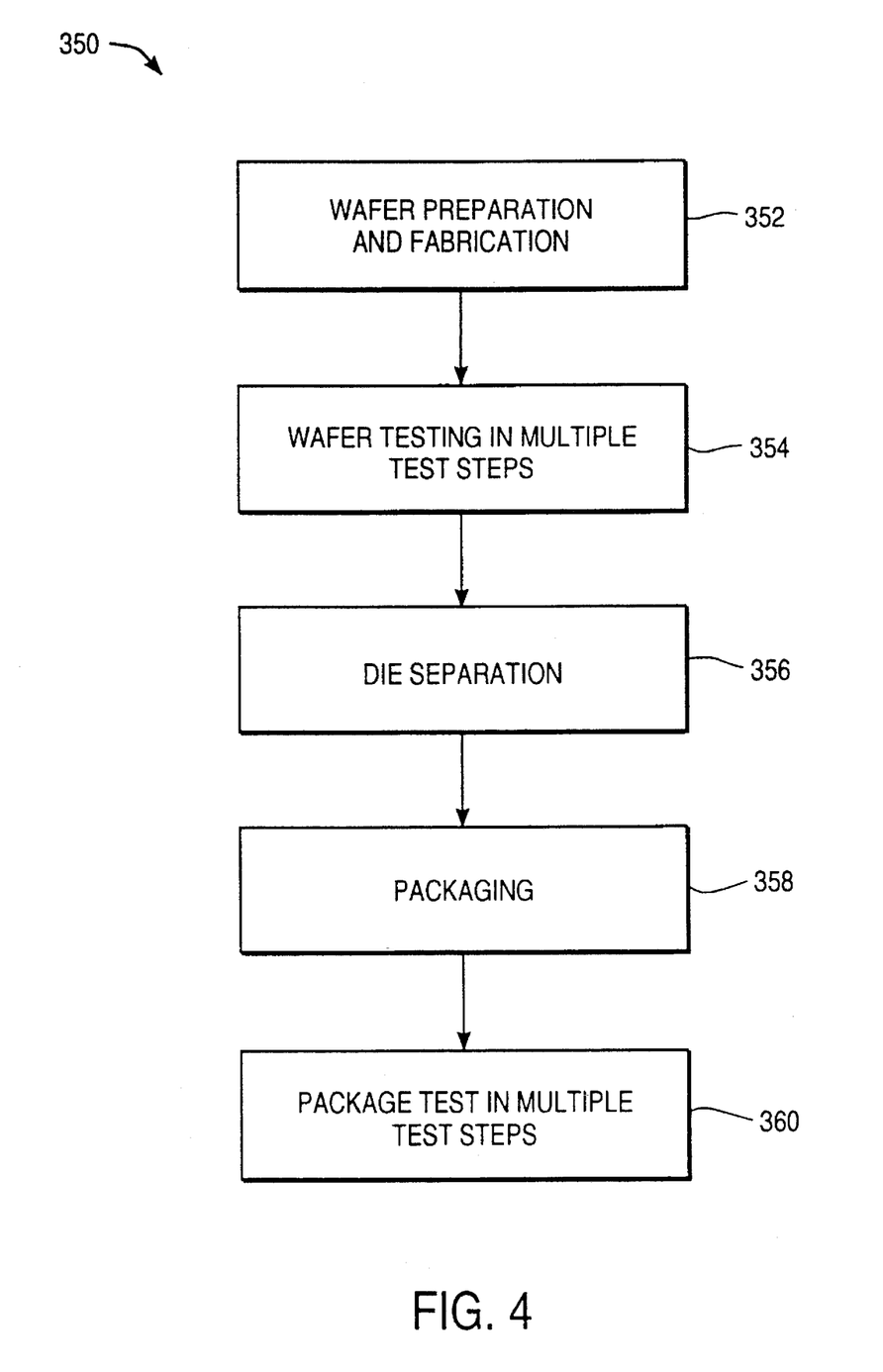
FIG. 4 is a flow diagram of the manufacturing process for an integrated circuit chip.

As noted above, integrated circuit chips customarily undergo exhaustive testing during the manufacture process prior to encapsulation in a package or use of the package on a circuit board in order to ensure reliable operation of the chip. The method and apparatus described above for efficiently testing an integrated circuit chip having more signal pins than the number of available channels on a tester by testing the chip in multiple testing steps is integrated into the chip manufacturing process 350, as shown in FIG. 4. Generally, the first step 352 involves the preparation of a semiconductor wafer through crystal growth and the fabrication of individual electrical circuits on the wafer through ion implantation. After the individual electrical circuits are fabricated on a semiconductor wafer, the wafer is tested in step 354 in multiple test steps, as described above, to identify the circuits that are within specified limits and those that are not. Once the good circuits have been identified, the wafer is separated into individual chip dice in step 356 so that only the good circuits are used further in the manufacture process. In step 358, each individual chip die is assembled into an appropriate device package suitable for incorporation into an end-use circuit. The device package is tested in step 360 in multiple test steps, as described above, to provide a final verification of reliability. The devices that pass the final manufacturing step are reliable, functioning semiconductor devices.

Figure 5:
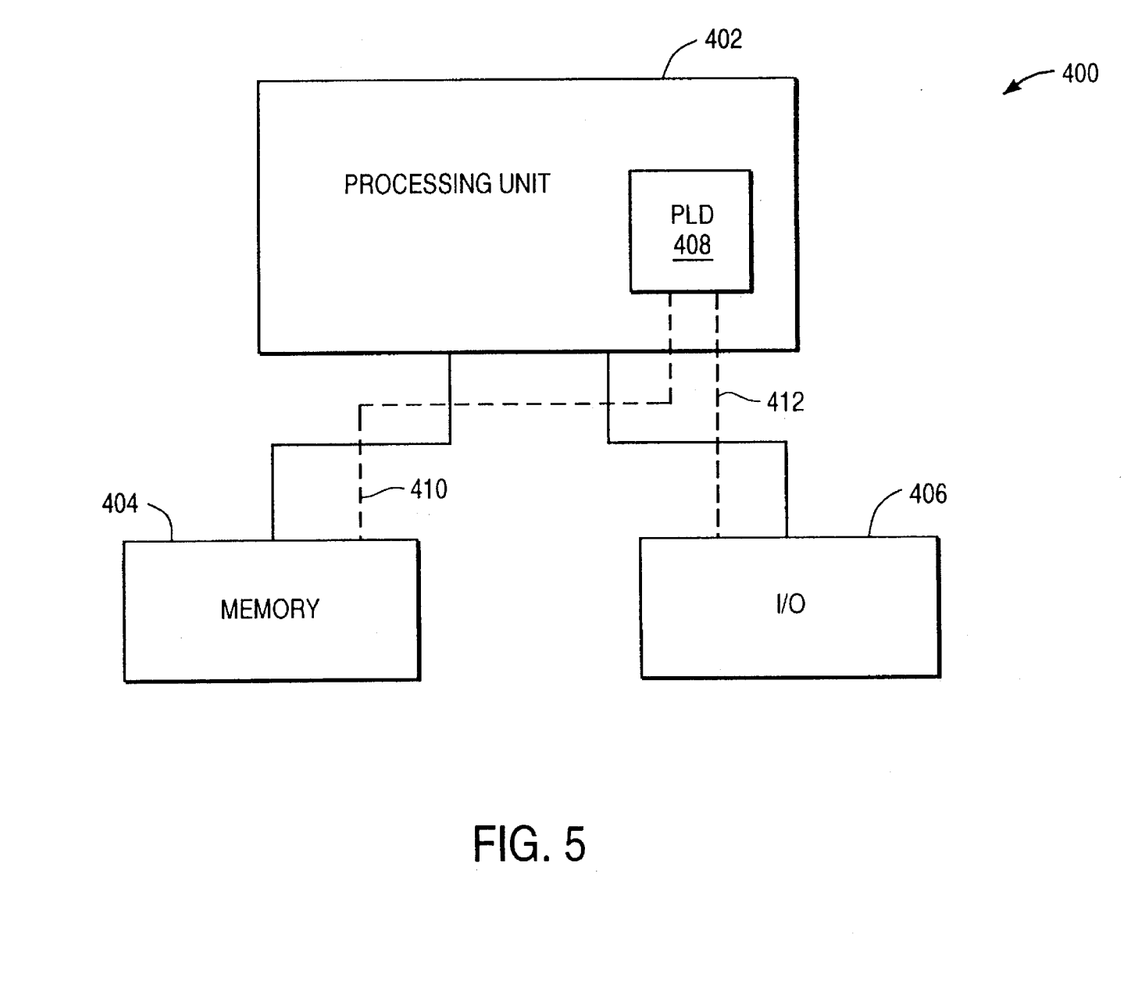
FIG. 5 is a block diagram of a digital system in which a device tested by the present invention may be embodied.

The purpose of carrying out tests on a DUT is, of course, to verify that the manufacturing process yields an operable semiconductor device suitable for end-use circuit and system level designs. As an example, FIG. 5 shows a block diagram of a digital system 400 within which a device tested by the present invention may be embodied. In the particular embodiment of FIG. 4, a processing unit 402 is coupled to a memory 404 and an I/O 406 and incorporates a programmable logic device (PLD) 408. PLD 408 may be specially coupled to memory 404 through connection 410 and to I/O 406 through connection 412. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 408, or a combination of a general purpose computer and auxiliary special purpose hardware.

Processing unit 402 may direct data to an appropriate system component for processing or storage, execute a program stored in memory 404 or input using I/O 406, or other similar function. Processing unit 402 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 408 may control the logical operations of the system.

In some embodiments, processing unit 402 may even be a computer system. In one embodiment, source code may be stored in memory 404, compiled into machine language, and executed by processing unit 402. Processing unit 402 need not contain a CPU and in one embodiment, instructions may be executed by one or more PLDs 408. Instead of storing source code in memory 404, only the machine language representation of the source code, without the source code, may be stored in memory 404 for execution by processing unit 402. Memory 404 may be a random access memory (RAM), read only memory (ROM), fixed or flexible disk media, PC Card flash disk memory, tape, or any other storage retrieval means, or any combination of these storage retrieval means.

Processing unit 402 uses I/O 406 to provide an input and output path for user interaction. For example, a user may input logical functions to be programmed into programmable logic device 408. I/O 406 may be a keyboard, mouse, track ball, digitizing tablet, text or graphical display, touch screen, pen tablet, printer, or other input or output means, or any combination of these means. In one embodiment, I/O 406 includes a printer used for printing a hard copy of any processing unit 402 output. In particular, using I/O 406, a user may print a copy of a document prepared using a word processing program executed using processing unit 402. In other cases, a user may print out a copy of the source code or a listing of the logical functions contained within PLD 408.

PLD may serve many different purposes within the system in FIG. 4. PLD 408 may be a logical building block of processing unit 402, supporting its internal and external operations. PLD 408 is programmed to implement the logical functions necessary to carry on its particular role in system operation.

As some examples of the multitude of uses for PLD 408, processing unit 402 may use PLD 408, through connection 410, to decode memory or port addresses for accessing memory 404 or I/O 406. PLD 408 may be programmed to store data like a memory or specialized memory, where this comes from processing unit 402 or memory 404 (via connection 410). PLD 408 may be used as a microcontroller for a memory 404 device such as a fixed or flexible disk drive. PLD 408 may also be configured to be a microcontroller for an I/O 406 device such as a keyboard or scanner, passing data through connection 412.

In other embodiments, PLD 408 may be used as a controller or specialized processing unit such as a coprocessor for performing mathematical or graphical calculations. In still other embodiments, PLD 408 may be used for telecommunications applications. For example, processing unit 402 would direct data to PLD 408; PLD 408 processes this data; then PLD 408 returns the results to processing unit 402. Furthermore, processing unit 402 may pass or direct a program stored in memory 404 or input using I/O 406 to PLD 408 for execution. These are some of multitude of uses of PLD 408 within a digital system. Also, a system such as the one shown in FIG. 4 may embody a plurality of PLDs 408, each performing different system functions.

The system shown in FIG. 4 may also be used for programming PLD 408 with a particular logic pattern. A computer program for designing functions into a PLD may be stored in memory 404 and executed using processing unit 402. Then, a design characteristic which is to be programmed into PLD 408 is input via I/O 406 and processed by processing unit 402. In the end, processing unit 402 transfers and programs the design characteristic into PLD 408.

In FIG. 4, processing unit 402 is shown incorporating PLD 408. However, in other embodiments, PLD 408 may be external to processing unit 402, and a PLD interface may be coupled between processing unit 402 and PLD 408. The PLD interface would provide the proper adapters or sockets for interfacing PLD 408 to processing unit 402. Moreover, the PLD interface would provide the proper voltages and electrical characteristics for coupling PLD 408 to processing unit 402.

The above description is illustrative and not restrictive. Many variations of the invention will become apparent to those of skill in the art upon review of this disclosure. For example, integrated circuit devices other than PLDs that also include portions that may be operated independently of each other may be tested using the method and apparatus of the present invention. The scope of the invention should, therefore, be determined not with reference to the above description, but instead should be determined with reference to the appended claims along with their full scope of equivalents.

What is claimed is:

1. A method for testing an integrated circuit chip having a plurality of pins with a tester having a plurality of tester channels in separate testing steps, the method comprising the steps of:

providing a first test card and a second test card;

performing a first test of the integrated circuit chip comprising the steps of:

coupling the plurality of tester channels through said first test card to the integrated circuit chip; and testing a first portion of the integrated circuit chip;

thereafter, performing a second test of the integrated circuit chip comprising the steps of:

coupling the plurality of tester channels through said second test card to the integrated circuit chip; and testing a second portion of the integrated circuit chip.

2. The method of claim 1 further comprising the step of repeating said coupling and testing steps if necessary until all of the plurality of pins have been coupled to the plurality of tester channels and all portions of the integrated circuit chip have been fully tested by the tester.

3. The method of claim 1 wherein the plurality of pins is greater than the plurality of tester channels.

4. The method of claim 1 wherein said step of coupling the plurality of tester channels through said first test card to the integrated circuit chip further comprises:

coupling the plurality of tester channels through said first test card to a first group of the plurality of pins; and
   coupling a second group of the plurality of pins to at least one reference potential, each pin in said second group being coupled to exactly one reference potential.

5. The method of claim 4 wherein said step of coupling the plurality of tester channels through said second test card to the integrated circuit chip further comprises:

coupling the plurality of tester channels through said second test card to said second group of the plurality of pins; and coupling said first group of the plurality of pins to said at least one reference potential, each pin in said first group being coupled to exactly one reference potential.

6. The method of claim 1 wherein said step of testing a first portion of the integrated circuit chip further comprises the steps of:

performing functional tests on said first portion of the integrated circuit chip; and performing parametric tests on said first portion of the integrated circuit chip.

7. The method of claim 1 wherein said step of testing a second portion of the integrated circuit chip further comprises the steps of:

performing functional tests on said second portion of the integrated circuit chip; and performing parametric tests on said second portion of the integrated circuit chip.

8. A method for testing a programmable logic device with a tester having a plurality of tester channels, the method comprising the steps of:

providing the programmable logic device having a plurality of user pins and a plurality of test pins, said plurality of user pins and said plurality of test pins being greater than the plurality of tester channels;

providing a first test card and a second test card;

coupling the plurality of tester channels through said first test card to the programmable logic device;

testing a first portion of the programmable logic device;

coupling the plurality of tester channels through said second test card to the programmable logic device; and testing a second portion of the programmable logic device.

9. The method of claim 8 further comprising the step of repeating said coupling and testing steps if necessary until all of the plurality of user pins have been coupled to the plurality of tester channels and the programmable logic device has been fully tested by the tester.

10. The method of claim 8 wherein said step of coupling the plurality of tester channels through said first test card to the programmable logic device further comprises:

coupling the plurality of tester channels through said first test card to said plurality of test pins and to a first group of said plurality of user pins; and coupling a second group of the plurality of user pins to at least one reference potential, each pin in said second group being coupled to exactly one reference potential.

11. The method of claim 10 wherein said step of coupling the plurality of tester channels through said second test card to the programmable logic device further comprises:

coupling the plurality of tester channels through said first test card to said plurality of test pins and to said second group of said plurality of user pins; and coupling said first group of the plurality of user pins to said at least one reference potential, each pin in said first group being coupled to exactly one reference potential.

12. The method of claim 10 wherein the step of testing a first portion of the programmable logic device further comprises the steps of:

programming said first portion of the programmable logic device through said plurality of test pins and said first group of said plurality of user pins with a first group of test patterns from the tester;

exercising said first group of test patterns in the programmable logic device with a first group of test vectors from the tester; and repeating said programming and exercising steps until said first portion of the programmable logic device has been fully tested by the tester.

13. The method of claim 11 wherein the step of testing a second portion of the programmable logic device further comprises the steps of:

programming said second portion of the programmable logic device through said plurality of test pins and said second group of said plurality of user pins with a second group of test patterns from the tester;

exercising said second group of test patterns in the programmable logic device with a second group of test vectors from the tester; and repeating said programming and exercising steps until said second portion of the programmable logic device has been fully tested by the tester.

14. A test apparatus comprising:

an integrated circuit chip having a plurality of signal pins;

an integrated circuit chip tester having a plurality of tester channels, said plurality of signal pins being greater than said plurality of tester channels; and a plurality of test cards, each test card coupling said plurality of tester channels to a selected group of said plurality of signal pins.

15. The test apparatus of claim 14 wherein said plurality of test cards further comprises:

a first test card coupling said plurality of tester channels to said a first group of said plurality of signal pins; and a second test card coupling said plurality of tester channels to a second group of said plurality of signal pins.

16. The test apparatus of claim 14 wherein said first test card further comprises at least one reference potential coupled to said second group of said plurality of signal pins, each pin in said second group being coupled to exactly one reference potential.

17. The test apparatus of claim 14 wherein said second test card further comprises at least one reference potential coupled to said first group of said plurality of signal pins, each pin in said first group being coupled to exactly one reference potential.

18. The test apparatus of claim 15 wherein said first group of said plurality of signal pins and said second group of said plurality of signal pins have one or more signal pins in common.

19. A test apparatus comprising:

a programmable logic device (PLD) having a plurality of test pins and a plurality of user pins;

a PLD tester having a plurality of tester channels, said plurality of test pins and said plurality of user pins being greater than said plurality of tester channels; and a plurality of test cards, each test card coupling said plurality of tester channels to said plurality of test pins and a selected group of said plurality of user pins.

20. The test apparatus of claim 19 wherein said plurality of test cards further comprises:

a first test card coupling said plurality of tester channels to said plurality of test pins and a first group of said plurality of user pins; and a second test card coupling said plurality of tester channels to said plurality of test pins and a second group of said plurality of user pins.

21. The test apparatus of claim 20 wherein said first test card further comprises at least one reference potential coupled to said second group of said plurality of user pins, each pin in said second group being coupled to exactly one reference potential.

22. The test apparatus of claim 20 wherein said second test card further comprises at least one reference potential coupled to said first group of said plurality of user pins, each pin in said first group being coupled to exactly one reference potential.

23. The test apparatus of claim 20 wherein said first group of said plurality of user pins and said second group of said plurality of user pins have one or more user pins in common.

24. The test apparatus of claim 19 wherein said PLD tester further comprises:

a first group of test patterns for programming a first portion of said programmable logic device;

a first group of test vectors for exercising said first group of test patterns in said first portion of said programmable logic device;

a second group of test patterns for programming a second portion of said programmable logic device; and a second group of test vectors for exercising said second group of test patterns in second portion of said programmable logic device.

25. A system comprising a programmable logic device tested by the method recited in claim 8.

26. A system comprising a programmable logic device tested by the apparatus recited in claim 19.

27. A method of manufacturing an integrated circuit chip having a plurality of pins comprising the steps of:

preparing and fabricating an electrical circuit on a semiconductor wafer; and verifying the electrical circuit with a tester having a plurality of tester channels, said verifying step comprising the steps of:

providing a first test card and a second test card;

coupling the plurality of tester channels through said first test card to the integrated circuit chip;

testing a first portion of the integrated circuit chip;

coupling the plurality of tester channels through said second test card to the integrated circuit chip; and testing a second portion of the integrated circuit chip.

28. The method of claim 27 further comprising the step of repeating said coupling and testing steps if necessary until all of the plurality of pins have been coupled to the plurality of tester channels and all portions of the integrated circuit chip have been fully tested by the tester.

29. The method of claim 27 wherein the plurality of pins is greater than the plurality of tester channels.

30. The method of claim 27 wherein said step of coupling the plurality of tester channels through said first test card to the integrated circuit chip further comprises:

coupling the plurality of tester channels through said first test card to a first group of the plurality of pins; and coupling a second group of the plurality of pins to at least one reference potential, each pin in said second group being coupled to exactly one reference potential.

31. The method of claim 30 wherein said step of coupling the plurality of tester channels through said second test card to the integrated circuit chip further comprises:

coupling the plurality of tester channels through said second test card to said second group of the plurality of pins; and coupling said first group of the plurality of pins to said at least one reference potential, each pin in said first group being coupled to exactly one reference potential.

32. The method of claim 27 wherein said step of testing a first portion of the integrated circuit chip further comprises the steps of:

performing functional tests on said first portion of the integrated circuit chip; and performing parametric tests on said first portion of the integrated circuit chip.

33. The method of claim 27 wherein said step of testing a second portion of the integrated circuit chip further comprises the steps of:

performing functional tests on said second portion of the integrated circuit chip; and performing parametric tests on said second portion of the integrated circuit chip.

* * * * *